US009786377B2

(12) United States Patent
Bushnaq et al.

(10) Patent No.: US 9,786,377 B2
(45) Date of Patent: Oct. 10, 2017

(54) MEMORY DEVICE

(71) Applicant: Toshiba Memory Corporation, Tokyo (JP)

(72) Inventors: Sanad Bushnaq, Yokohama Kanagawa (JP); Xu Li, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/288,802

(22) Filed: Oct. 7, 2016

(65) Prior Publication Data

US 2017/0263322 A1    Sep. 14, 2017

(30) Foreign Application Priority Data

Mar. 11, 2016    (JP) .................................. 2016-048694

(51) Int. Cl.
| | | |
|---|---|---|
| *G11C 11/34* | (2006.01) | |
| *G11C 16/16* | (2006.01) | |
| *G11C 16/08* | (2006.01) | |
| *G11C 16/04* | (2006.01) | |
| *G11C 16/26* | (2006.01) | |

(52) U.S. Cl.
CPC .......... *G11C 16/16* (2013.01); *G11C 16/0483* (2013.01); *G11C 16/08* (2013.01); *G11C 16/26* (2013.01)

(58) Field of Classification Search
CPC ..... G11C 16/16; G11C 16/0483; G11C 16/08; G11C 16/26
USPC .... 365/185.11, 185.09, 185.17, 185.23, 129, 365/154, 189.011, 189.17, 189.15, 365/189.16, 189.2, 189.05
See application file for complete search history.

(56) References Cited

U.S. PATENT DOCUMENTS

| | | | |
|---|---|---|---|
| 6,222,762 | B1 | 4/2001 | Guterman et al. |
| 7,142,453 | B2 | 11/2006 | Futatsuyama |
| 7,760,579 | B2 | 7/2010 | Kang |
| 8,971,115 | B2 | 3/2015 | Hosono |
| 2014/0293680 | A1* | 10/2014 | Nii ........................... G11C 5/06 365/154 |
| 2016/0342332 | A1* | 11/2016 | Kang .................... G06F 3/0604 |

FOREIGN PATENT DOCUMENTS

JP    2014170598 A    9/2014

\* cited by examiner

*Primary Examiner* — Fernando Hidalgo
(74) *Attorney, Agent, or Firm* — Patterson & Sheridan, LLP

(57) ABSTRACT

A memory device includes a memory cell array including a plurality of memory cell groups, and a decoder circuit configured to control selection of the memory cell groups. The decoder circuit includes an address decoder circuit configured to activate the decoder circuit based on an input address, a plurality of information retention circuits, each of which corresponds to one of the memory cell groups and outputting a signal that indicates whether or not the corresponding memory cell group is defective, a transistor having a gate connected to each of the outputs of the information retention circuits, and a signal output circuit configured to output a control signal for selecting or not selecting the memory cell groups based on an on/off state of the transistor.

20 Claims, 9 Drawing Sheets

MEMORY DEVICE

CROSS-REFERENCE TO RELATED APPLICATION

This application is based upon and claims the benefit of priority from Japanese Patent Application No. 2016-048694, filed Mar. 11, 2016, the entire contents of which are incorporated herein by reference.

FIELD

Embodiments described herein relate generally to a memory device.

BACKGROUND

A NAND flash memory in which the memory cells are arranged three-dimensionally is generally known.

DETAILED DESCRIPTION

Figure 1:
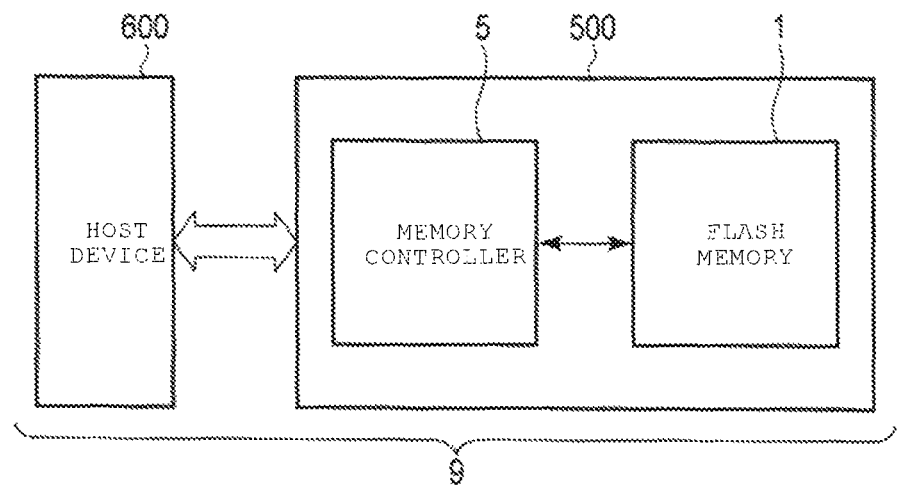
FIG. 1 is a block diagram illustrating a memory system including a memory device according to an embodiment.

A manufacturing cost of a memory device according to embodiment is reduced.

In general, according to an embodiment, a memory device includes a memory cell array including a plurality of memory cell groups, and a decoder circuit configured to control selection of the memory cell groups. The decoder circuit includes an address decoder circuit configured to activate the decoder circuit based on an input address, a plurality of information retention circuits, each of which corresponds to one of the memory cell groups and outputting a signal that indicates whether or not the corresponding memory cell group is defective, a transistor having a gate connected to each of the outputs of the information retention circuits, and a signal output circuit configured to output a control signal for selecting or not selecting the memory cell groups based on an on/off state of the transistor.

Hereinafter, embodiments will be described with reference to the drawings. In the following description, common reference numerals are given to elements having the same function and configuration.

In addition, in the following, when elements having reference numerals (for example, a word line WL, a bit line BL, various voltages and signals, and the like) with numbers or English letters at the end thereof are not distinguished from each other, the description of the elements will be made with the corresponding reference numerals without the numbers or English letters at the end thereof.

Embodiments

A memory device according to embodiments will be described with reference to FIGS. 1 to 10.

1. Configuration

A configuration example of the memory device according to the embodiment will be described with reference to FIGS. 1 to 8.

As illustrated in FIG. 1, a memory system 9 including a memory device according to the embodiment has a storage device 500 and a host device 600.

The host device 600 is, for example, coupled to the storage device 500 by a connector, a cable, wireless communication, an intranet, an Internet, and the like.

The host device 600 requests writing or erasing of data and reading of the data, to the storage device 500. The storage device 500 is operated in accordance with a request from the host device 600.

The storage device 500 includes a memory controller 5 and a memory device (e.g., semiconductor memory) 1. The memory controller 5 causes the memory device 1 to execute an operation in response to the request of the host device 600.

The memory controller 5 transfers data from the memory device 1 to the host device 600. The memory controller 5 transfers data from the host device 600 to the memory device 1. The memory controller 5 also performs an ECC process to the data.

The memory controller 5 holds management information (e.g., management table) for managing the memory device 1 and a program for controlling an operation of the memory device 1.

The memory device 1 stores data. The memory device 1 executes writing of data, reading of data, and erasing of data based on an instruction (request of the host device 600) from the memory controller 5.

The memory device 1 is, for example, a NAND type flash memory. For example, the storage device 500 (or the memory system 9) including the memory device 1 is a memory card (for example, an SD™ card and an eMMC™), a USB memory, a solid state drive (SSD), and the like.

Figure 2:
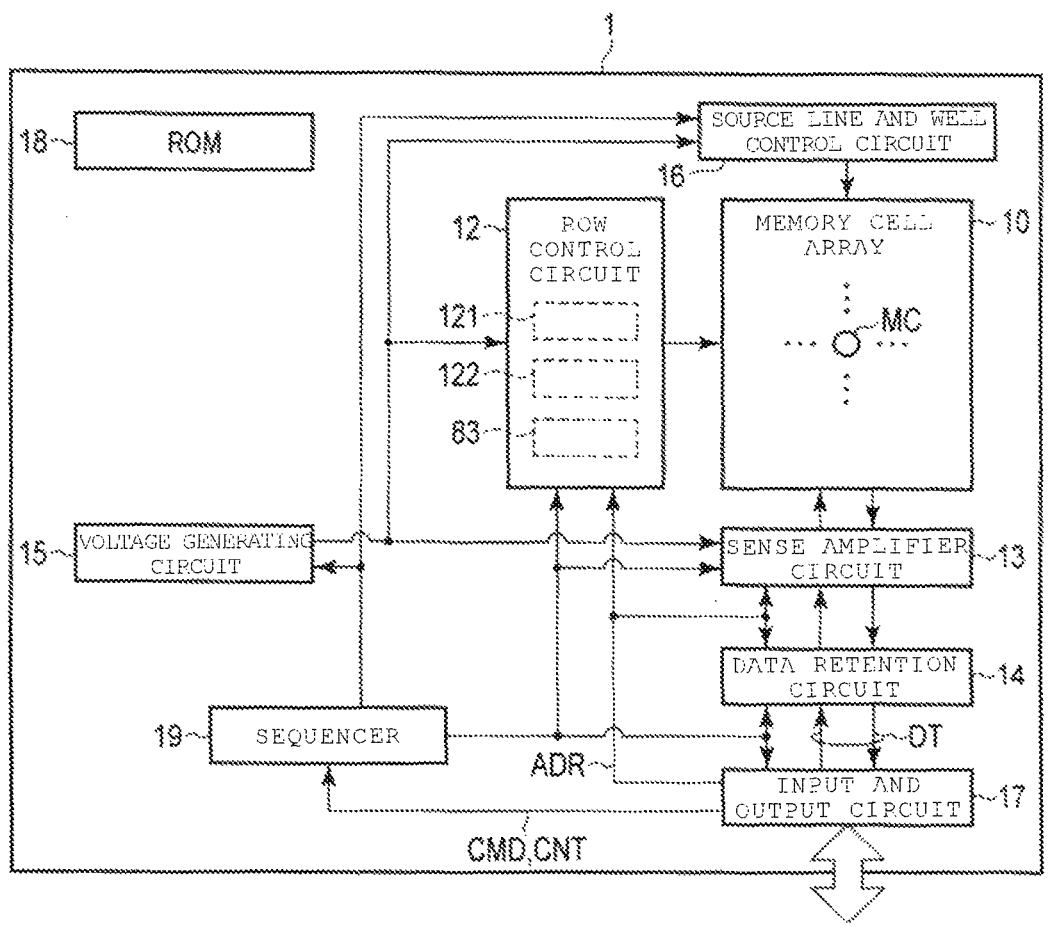
FIG. 2 is a block diagram illustrating an internal configuration of the memory device according to the embodiment.

As illustrated in FIG. 2, the memory device 1 includes a memory cell array 10, a row control circuit 12, a sense amplifier circuit 13, a data retention circuit 14, a voltage generating circuit 15, a source line and well control circuit 16, an input and output circuit 17, a ROM region 18, and a sequencer 19.

The memory cell array 10 includes a plurality of memory cells MC.

The row control circuit 12 controls rows (for example, word lines) of the memory cell array 10. For example, the row control circuit 12 includes a row decoder circuit 121, a switch circuit 122, and a driver circuit 83.

The row decoder circuit 121 decodes an address. The switch circuit 122 selects wiring in the memory cell array 10 based on a signal from the row decoder circuit 121. The driver circuit 83 supplies a voltage to the wiring in the memory cell array and drives the wiring.

The sense amplifier circuit 13 senses and amplifies a signal output to a bit line in the memory cell array 10 during reading of data. For example, the sense amplifier circuit 13 senses generation of a current in the bit line or variation of a potential of the bit line as a signal in accordance with a data holding state of the memory cell MC. Therefore, the sense amplifier circuit 13 reads data held in the memory cell MC. In addition, the sense amplifier circuit 13 controls the potential of the bit line in response to data to be written during writing of data.

The data retention circuit (for example, a page buffer circuit) 14 temporarily retains data output from the memory cell array 10 and data input into the memory cell array 10.

The voltage generating circuit 15 generates various voltages used in operating the memory device 1. One or more power supply voltages and a ground voltage are supplied to the voltage generating circuit 15 via a terminal (pad or pin) of the memory device 1. The voltage generating circuit 15 generates various voltages from the power supply voltage and the ground voltage. The voltage generating circuit 15 outputs the various generated voltages to circuits of the memory device 1.

The source line and well control circuit 16 controls a potential of a source line in the memory cell array 10. The source line and well control circuit 16 controls a potential of the well region in the memory cell array 10.

The input and output circuit 17 receives data DT, an address ADR, and a command, from the memory controller 5. The input and output circuit 17 supplies the data DT from the memory controller 5 to the data retention circuit 14. The input and output circuit 17 supplies the data DT from the memory cell array 10 to the memory controller 5. The input and output circuit 17 supplies the address ADR to the row control circuit 12, the sense amplifier circuit 13, and the data retention circuit 14. The input and output circuit 17 supplies a command CMD to the sequencer 19. The input and output circuit 17 communicates a control signal CNT between the sequencer 19 of the memory device 1 and the memory controller 5.

The ROM region 18 stores setting information of the memory device 1, defect information in the memory cell array 10, and the like. The setting information and the defect information also may be stored in a certain region in the memory cell array 10.

The sequencer 19 controls an entire operation of the memory device 1. The sequencer 19 controls an operation of an inside of the memory device 1 based on the control signal CNT and the command CMD.

Figure 3:
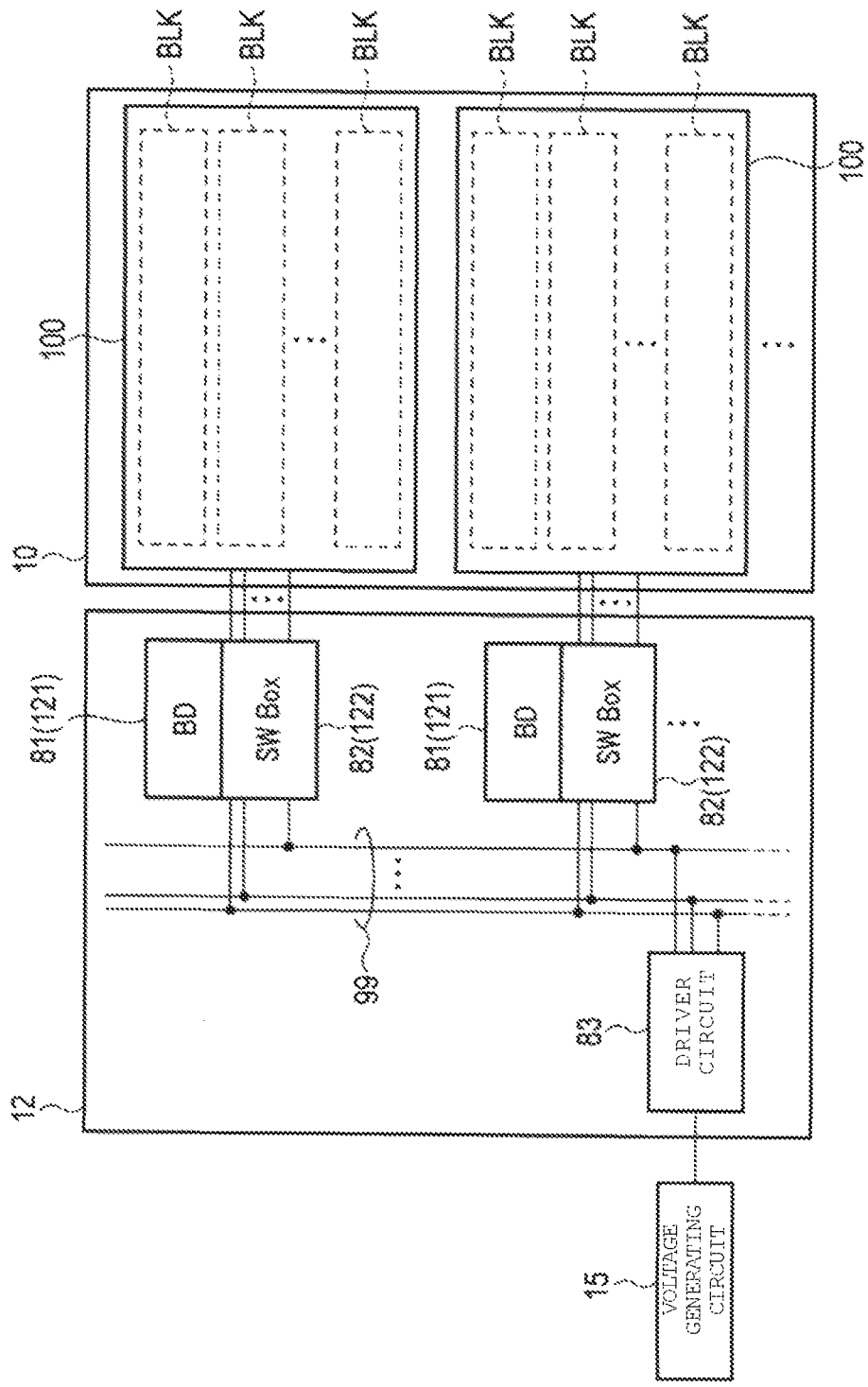
FIG. 3 is a block diagram depicting in more detail some of the components of the internal configuration of the memory device according to the embodiment shown in FIG. 2.

FIG. 3 is a block diagram schematically illustrating a configuration example of the memory cell array and the row control circuit of the memory device 1 according to the embodiment.

As illustrated in FIG. 3, the memory cell array 10 includes a plurality of blocks BLK.

In the memory device 1, the block BLK is an erasing unit of data. However, an erasing operation for the memory cell array 10 may be performed for a unit of storage (storage region) smaller than the block. The erasing operations described in "NON-VOLATILE SEMICONDUCTOR STORAGE DEVICE AND METHOD OF MANUFAC- TURING THE SAME" of U.S. patent application Ser. No. 12/679,991, filed Mar. 25, 2010, and "SEMICONDUCTOR MEMORY AND METHOD FOR MANUFACTURING SAME" of U.S. patent application Ser. No. 12/532,030, filed Mar. 23, 2009, both of which are incorporated by reference herein in their entirety, may be employed in the embodiments.

The row control circuit 12 includes the row decoder circuit 121, the switch circuit 122, and the driver circuit 83.

The row decoder circuit 121 includes a plurality of block decoders 81. One block decoder 81 is shared by a plurality of blocks. In the following description, the block decoder 81 shared for the plurality of blocks BLK is referred to as a shared block decoder. In addition, a set (control unit) 100 of a plurality of blocks corresponding to a certain block decoder (shared block decoder) are referred to as the block set 100.

The block decoder 81 decodes the address ADR. The block decoder 81 supplies a signal to the switch circuit 122 based on the decoded address. The block decoder 81 holds defect information (hereinafter, referred to as bad block information) of blocks BLK.

The switch circuit 122 includes a plurality of switch boxes 82.

Each of the switch boxes 82 corresponds to a different one of the block decoders 81. One switch box 82 is connected to the plurality of blocks BLK. The switch box 82 is connected to a wiring group 99.

The switch box 82 controls selection (activation) and non-selection (non-activation) of the blocks BLK based on the control signal from the block decoder 81. The switch box 82 can non-activate a defect block BLK based on the bad block information held in the block decoder 81.

The switch box 82 connects wirings (word line WL and select gate lines SGD and SGS) in a selected block BLK to control lines included in the wiring group 99 corresponding thereto.

The driver circuit 83 is connected to the wiring group 99 including the plurality of control lines.

The driver circuit 83 transfers a voltage to be applied to wiring in the block BLK (memory cell array 10), from the voltage generating circuit 15 to the wiring group 99. Then, various voltages for operating the selected block BLK are applied to the wiring in the block BLK via the switch box 82.

Configuration Example of Memory Cell Array

Figure 4:
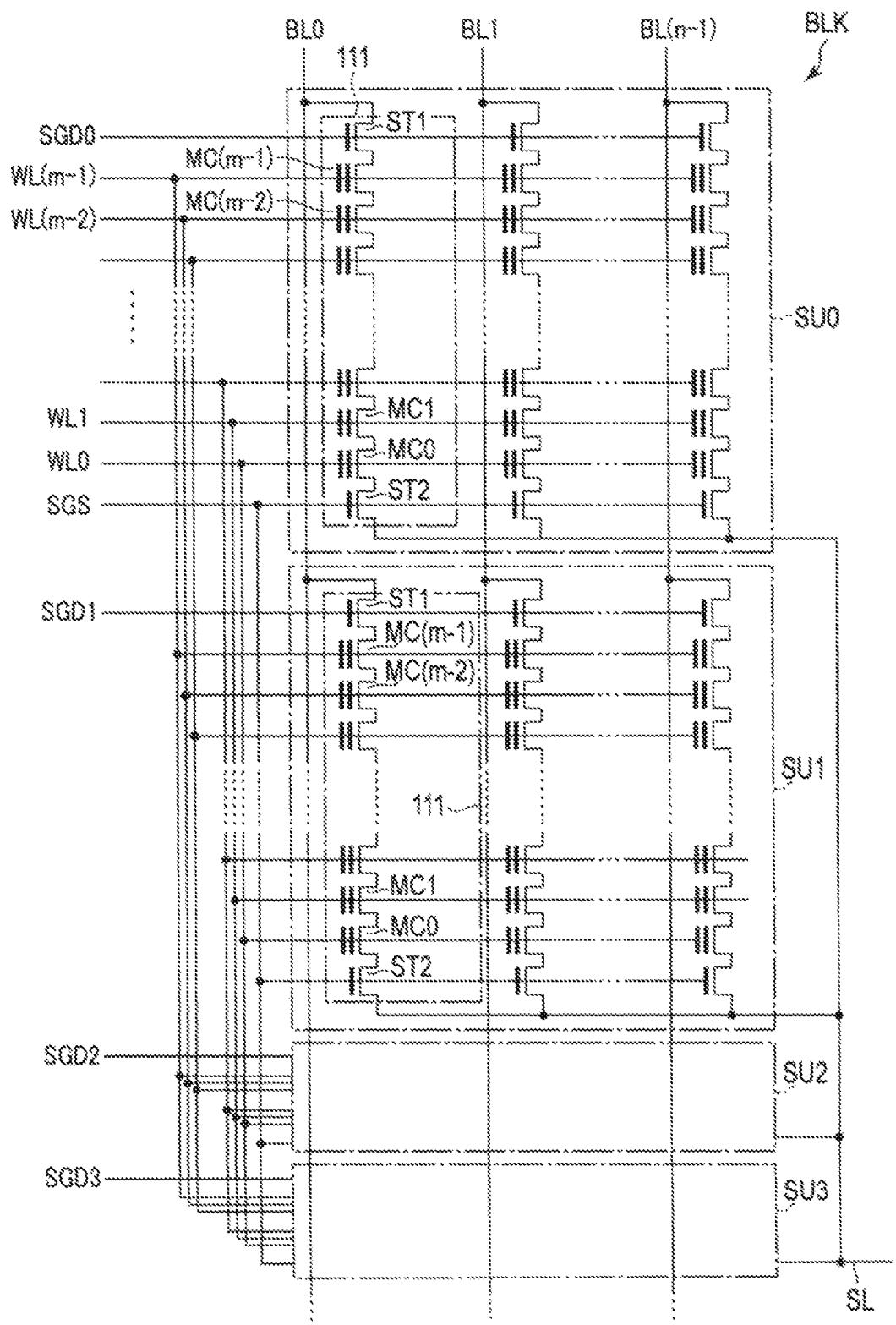
FIG. 4 is a diagram illustrating an internal configuration of a memory cell array of the memory device according to the embodiment.

FIG. 4 illustrates a configuration example of a block of the memory device according to the embodiment.

In the illustrated example, the memory device 1 according to the embodiment has a three-dimensional structured memory cell array 10.

In the three-dimensional structured memory cell array 10 illustrated in FIG. 4, one block BLK includes a plurality of (for example, four) string units SU (SU0, SU1, SU2, and SU3).

The plurality of string units SU includes a plurality of NAND strings (memory strings) 111. The NAND string 111 includes a plurality of memory cells (also referred to as a memory portion or a memory element) MC (MC0, MC1, . . . , MCm-2, and MCm-1) and a plurality of select transistors ST1 and ST2.

The memory cell MC includes a control gate and a charge storage layer (memory film). The plurality of memory cells MC are connected in series between the select transistors ST1 and ST2 in the NAND string 111. One end of the memory cell MC on the drain side among the plurality of memory cells MC which are connected in series is connected to one end of the select transistor ST1 on the drain side. One end of the memory cell MC on the source side among the plurality of memory cells MC which are connected in series is connected to one end of the select transistor ST2 on the source side.

A plurality of word lines WL (WL0, WL1, . . . , WLm-2, and WLm-1) are respectively connected to a gate of a corresponding memory cell MC. Symbol "m" represents a natural number of 2 or more. For example, one word line WL is connected in common to the plurality of memory cells MC across the plurality of string units SU. Writing of the data and reading of the data are performed collectively for the plurality of memory cells MC connected to any one word line WL in any one string unit SU. The unit of writing/reading of the data is referred to as "page" PG.

A plurality of drain-side select gate lines SGD (SGD0 to SGD3) are respectively connected to gates of a plurality of drain-side select transistors ST1 of corresponding string units SU.

The source-side select gate lines SGS are respectively connected to gates of a plurality of source-side select transistors ST2 of a plurality of string units SU.

The other end of one drain-side select transistor ST1 is connected to one of bit lines BL (BL0, BL1, . . . , and BLn-1). In addition, symbol "n" represents a natural number of 1 or more.

The other end of a plurality of source-side select transistors ST2 is connected to a source line SL in common.

The number of the blocks BLK in the memory cell array 10, the number of the string units SU in one block BLK, and the number of the memory cells MC in the NAND string 111 may be selected to be any number. In addition, a plurality of source-side select gate lines may be provided in one block BLK. In the case illustrated in FIG. 4, one source-side select gate line is provided to one string unit SU.

Figure 5:
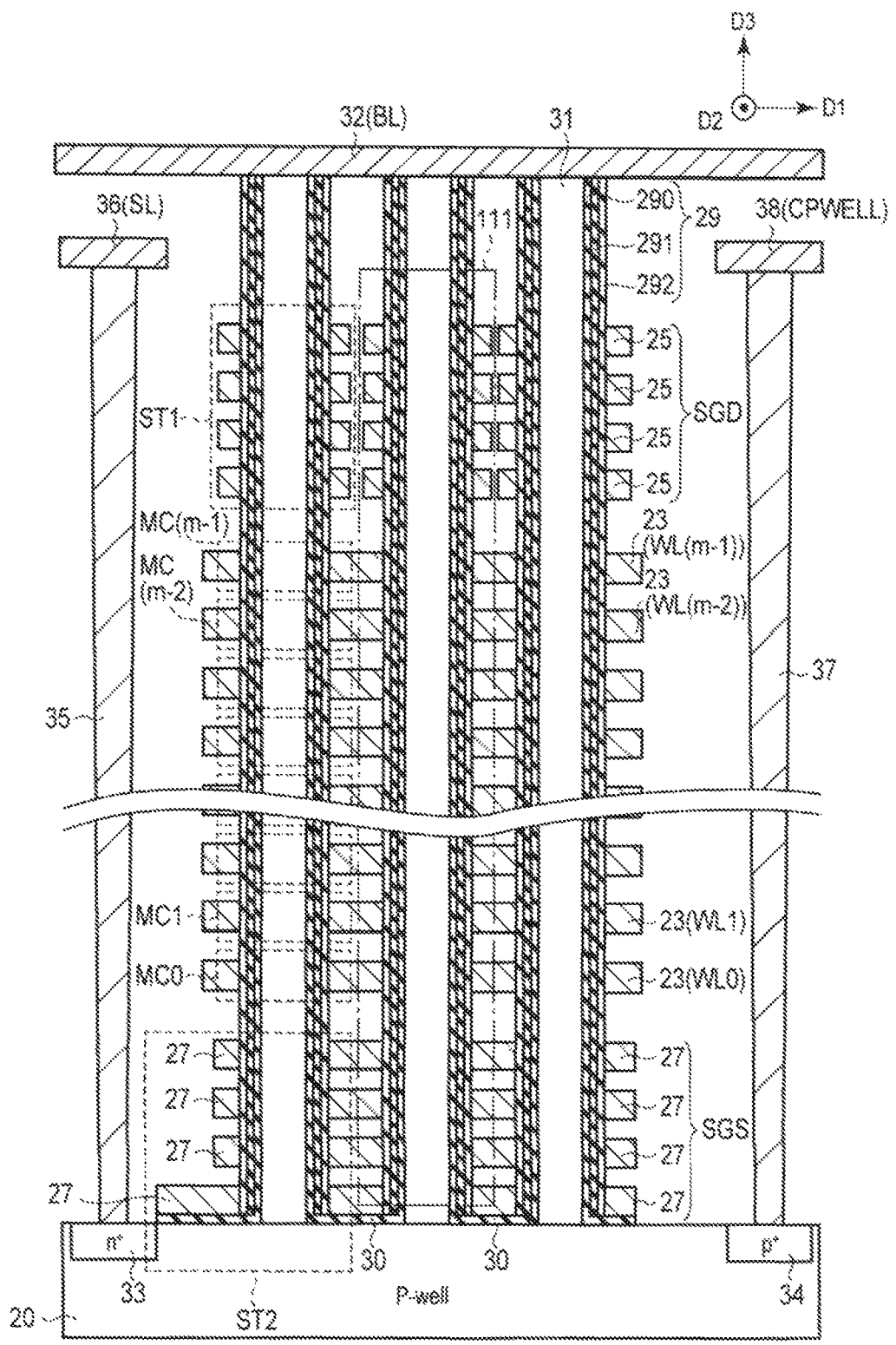
FIG. 5 is a sectional view illustrating a structure of the memory cell array of the memory device according to the embodiment.

FIG. 5 is a schematic sectional view illustrating the three-dimensional structure of the memory cell array 10. In FIG. 5, for the sake of simplification of illustration, only three NAND strings are illustrated.

As illustrated in FIG. 5, the plurality of NAND strings 111 are provided on a p-type well region 20 in a semiconductor region (for example, Si substrate).

A semiconductor pillar 31 is provided on the p-type well region 20. The semiconductor pillar 31 extends in a D3 direction (perpendicular to a front surface of the well region 20). The semiconductor pillar 31 functions as a current path of the NAND string 111. The semiconductor pillar 31 is a region in which channels of the memory cell MC and the transistor ST are formed during operations of the memory cell MC and the select transistors ST1 and ST2.

Due to a manufacturing process of the memory cell array 10, a diameter of the semiconductor pillar 31 on a lower end side (source side of the NAND string 111) may be smaller than a diameter of the semiconductor pillar 31 on an upper end side (drain side of the NAND string).

A memory film 29 is provided on a side surface of the semiconductor pillar 31. A gate insulating film 290, a charge storage layer (insulating film) 291, and a block insulating film 292 are provided in the memory film 29 in order from the semiconductor pillar 31 side.

A plurality of conductive layers 23, 25, and 27 are stacked on the well region 20 with an inter-layer insulating film (not illustrated) interposed between the conductive layers 23, 25, and 27. Each of the conductive layers 23, 25, and 27 is provided on a side surface of the semiconductor pillar 31 via the memory film 29. Each of the conductive layers 23, 25, and 27 extends in a D2 direction.

A plurality of conductive layers 23 respectively function as the word line WL.

A plurality (four in the example) of conductive layers 25 are connected to the same drain-side select gate line SGD in each NAND string 111. Four conductive layers 25 collectively function as a gate electrode of one select transistor ST1.

A plurality (four in the example) of conductive layers 27 are connected to the same source-side select gate line SGS. Four conductive layers 27 collectively function as a gate electrode of one select transistor ST2. The conductive layers (source-side select gate lines) 27 in the same string unit SU are connected in common to each other.

A conductive layer 32 that functions as a bit line BL is provided above an upper end of the semiconductor pillar 31. The bit line BL is electrically connected to the semiconductor pillar 31 via a plug (not illustrated). The conductive layer 32 extends in a D1 direction.

An $n^+$-type impurity diffusion layer 33 and a $p^+$-type impurity diffusion layer 34 are provided in a surface region of the well region 20.

A contact plug 35 is provided on the diffusion layer 33. A conductive layer 36 is provided on the contact plug 35. The conductive layer 36 functions as the source line SL. A gate insulating film 30 is formed on the well region 20 between adjacent NAND strings 111. The conductive layer 27 and the gate insulating film 30 extend to the vicinity of the diffusion layer 33. Therefore, when the select transistor ST2 is in an ON state, the channel of the select transistor ST2 electrically connects the memory cell MC and the diffusion layer 33.

A contact plug 37 is provided on the diffusion layer 34. A conductive layer 38 is provided on the contact plug 37. The conductive layer 38 functions as a well wiring CPWELL. A voltage is applied to the well wiring CPWELL, whereby a potential can be applied to the semiconductor pillar 31.

The plurality of NAND strings 111 are arranged in the D2 direction. Each string unit SU is a set of the plurality of NAND strings 111 arranged in the D2 direction.

In each NAND string 111, the select transistor ST2, the plurality of memory cells MC, and the select transistor ST1 are sequentially stacked on the well region 20.

The memory cell MC is provided in a position along the semiconductor pillar 31 of the conductive layer 23. The drain-side select transistor ST1 is provided in a position the semiconductor pillar 31 of the conductive layer 25. The source-side select transistor ST2 is provided in a position the semiconductor pillar 31 of the conductive layer 27.

A charge is injected into the memory film 29, whereby a threshold voltage of the memory cell MC is changed. Data is written to the memory cell by using the change in the threshold voltage of the memory cell MC. For example, the memory cell MC is capable of storing data equal to or greater than one bit.

In the three-dimensional structure memory cell array, one NAND string 111 may include two semiconductor pillars stacked in the D3 direction.

The embodiment may employ a structure, an operation, and a manufacturing method of a three dimensional structure memory cell array described in "THREE DIMENSIONAL STACKED NONVOLATILE SEMICONDUCTOR MEMORY" of U.S. patent application Ser. No. 12/407,403, filed Mar. 19, 2009, in "THREE DIMENSIONAL STACKED NONVOLATILE SEMICONDUCTOR MEMORY" of U.S. patent application Ser. No. 12/406,524, filed Mar. 18, 2009, in "NON-VOLATILE SEMICONDUCTOR STORAGE DEVICE AND METHOD OF MANUFACTURING THE SAME" of U.S. patent application Ser.

No. 12/679,991, filed Mar. 25, 2010, and in "SEMICONDUCTOR MEMORY AND METHOD FOR MANUFACTURING SAME" of U.S. patent application Ser. No. 12/532,030, filed Mar. 23, 2009, all of which are incorporated by reference herein in their entirety.

Configuration Example of Switch Circuit and Driver Circuit

Figure 6:
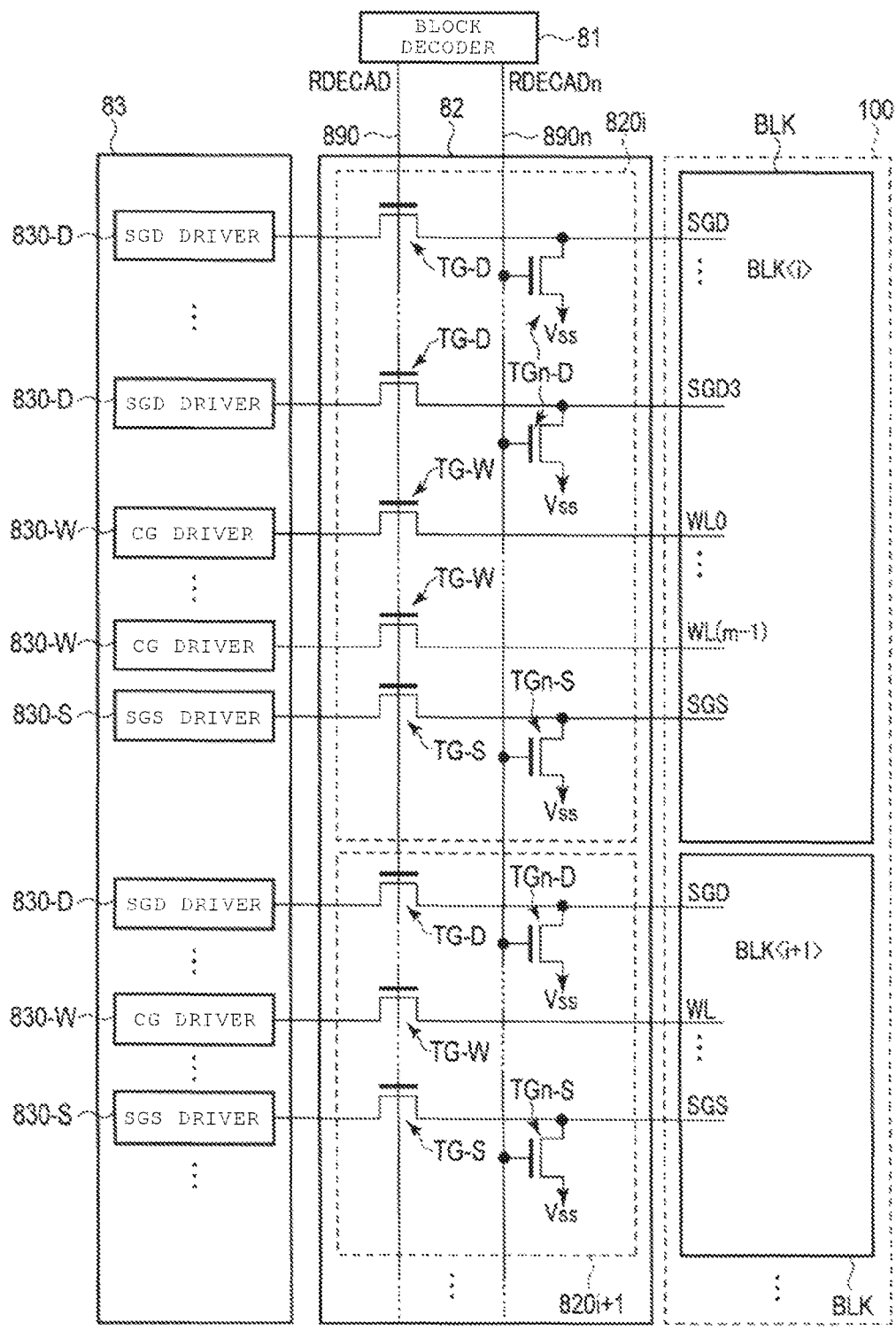
FIG. 6 is a circuit diagram illustrating the internal configuration of the memory device according to the embodiment shown in FIG. 2.

FIG. 6 is a diagram schematically illustrating a configuration example of a switch circuit and the driver circuit in the memory device according to the embodiment.

FIG. 6 illustrates a relationship between one block set 100 and the driver circuit 83. An internal configuration of the switch box 82 in one shared block decoder 81 is also illustrated in FIG. 6.

In the embodiment illustrated herein, the block set 100 includes four blocks BLK (BLKi, BLKi+1, ... ). One block decoder 81 is provided for the four blocks BLK.

The block decoder 81 supplies control signals RDECAD and RDECADn to the switch box 82.

The switch box 82 controls the connection between the plurality of blocks BLK and the driver circuit 83 based on the control signals RDECAD and RDECADn.

The switch box 82 includes a plurality of switch units 820. Each switch unit 820 is a set of switch elements provided for one block BLK. Each of switch units 820i, 820i+1, and ... is connected to a different one the blocks BLK.

Each switch unit 820 (820i, 820i+1, ... ) includes a plurality of switch elements TG (TG-D, TG-S, and TG-W), and TGn (TGn-D, TGn-S, and TGn-W). The switch elements TG and TGn are field effect transistors.

In the switch unit 820i corresponding to the block BLKi, the transistors (transfer transistors) TG-D, TG-W, and TG-S correspond to each wiring SGD, WL, and SGS in the block BLKi.

The driver circuit 83 includes a plurality of drivers 830 (drain-side select gate line driver 830-D, a word line driver 830-W, a source-side select gate line driver 830-S) so as to correspond to the wirings of the block BLK.

Each driver 830 is connected to the wiring in the block BLK corresponding to the driver 830 via the switch element TG.

The driver 830 supplies a voltage to be supplied to the selected block to the wirings WL, SGD, and SGS via the transistors TG by control of the sequencer 19. The driver 830 corresponding to the unselected block is disconnected from the wirings WL, SGD, and SGS via the transistors TG and the voltage Vss is supplied to the wirings WL, SGD, and SGS via the transistors TGn.

Hereinafter, a connection relationship between the transistors TG and TGn, and the driver 830 will be described in detail.

Transistors TG-W, TG-S, and TG-D in one switch unit 820i are respectively connected to the word line and the select gate line in one block BLK.

A plurality of transistors TG-D is provided for a plurality of drain-side select gate lines SGD in one block one-to-one. One end (one of source/drain) of the transistor TG-D is connected to one select gate line SGD. The other end (other end of source/drain) of the transistor TG-D is connected to the drain-side select gate line driver 830-D.

The transistor TG-W corresponds to the word line WL one-to-one. That is, one end of the transistor TG-W is connected to one word line WL. The other end of the transistor TG-W is connected to the word line driver 830-W.

The transistor TG-S is connected to one source-side select gate line SGS. One end of the transistor TG-S is connected to the source-side select gate line SGS in the block BLK.

The other end of the transistor TG-S is connected to the source-side select gate line driver 830-S.

A plurality of transistors TGn-D is provided for the plurality of drain-side select gate line SGD in the block BLK one-to-one. One end of the transistor TGn-D is connected to the drain-side select gate line SGD. The other end of the transistor TGn-D is connected to a node (terminal or wiring) Vss. The node Vss is a node (hereinafter, referred to as a ground node) to which the ground voltage Vss is applied.

The transistor TGn-S corresponds to the source-side select gate line SGS in the block BLK. One end of the transistor TGn-S is connected to the source-side select gate line SGS. The other end of the transistor TGn-S is connected to the ground node Vss.

Moreover, similar to the switch unit 820i, the switch unit 820i+1 also includes a plurality of transistors TG and TGn. That is, the plurality of transistors TG and TGn in the switch unit 820i+1 are also connected to each driver 830 and each of the wirings SGD, WL, and SGS.

Gates of the transistors TG-D, TG-W, and TG-S are connected to a node 890 of the block decoder 81. A control signal RDECAD is commonly supplied to the transistors TG of a plurality of switch units 820i, 820i+1, ... from the node 890. That is, the transistor TG is turned on or turned off in accordance with a signal level of the control signal RDECAD.

The gates of the transistors TGn-D and TGn-S are connected to a node 890n of the block decoder 81. The control signal RDECADn is commonly supplied to the transistors TGn-D and TGn-S of the plurality of switch units 820 from the node 890n. That is, the transistor TGn is turned on or turned off in accordance with the signal level of the control signal RDECADn.

The control signal RDECAD and the control signal RDECADn have a complementary relationship with each other. When the control signal RDECAD is at an H (high) level, the control signal RDECADn is at an L (low) level. On the other hand, when the control signal RDECAD is at the L level, the control signal RDECADn is at the H level.

In addition, a signal of the H level has a voltage for setting an n-type transistor to an ON state. A p-type transistor is turned off by the signal of the H level. The signal of the L level has a voltage value for setting the p-type transistor to an ON state. The n-type transistor is turned off by the signal of the L level.

For example, for a block that is capable of being used by a user to store data, the block decoder 81 sets the control signal RDECAD to the H level. On the other hand, for a defect block (hereinafter, referred to as a bad block), the block decoder 81 sets the control signal RDECAD to the L level.

The signal levels of the control signals RDECAD and RDECADn are controlled based on bad block information in the block decoder 81.

Hereinafter, the control of the switch unit 820 will be described in detail based on the bad block information in the block decoder 81.

When the control signal RDECAD is at the H level and the control signal RDECADn is at the L level, an output voltage of each driver 830 is supplied to each of the drain-side select gate line SGD, the word line WL, and the source-side select gate line SGS via the transistor TG in the ON state.

Therefore, a voltage for the operation of the block BLK is supplied to the selected word line BLk.

When the control signal RDECAD is at the L level and the control signal RDECADn is at the H level, each driver 830 is electrically isolated from the wirings SGD, WL, and SGS in the block BLK by the transistor TG in the OFF state. In this case, the voltage of the node Vss is supplied to the drain-side select gate line SGD and the select gate line SGS via the transistors TGn-D and TGn-S in the ON state.

Therefore, the potential of the select gate lines SGD and SGS in the block BLK is controlled so that the bad block is not driven.

Configuration Example of Block Decoder

Figure 7:
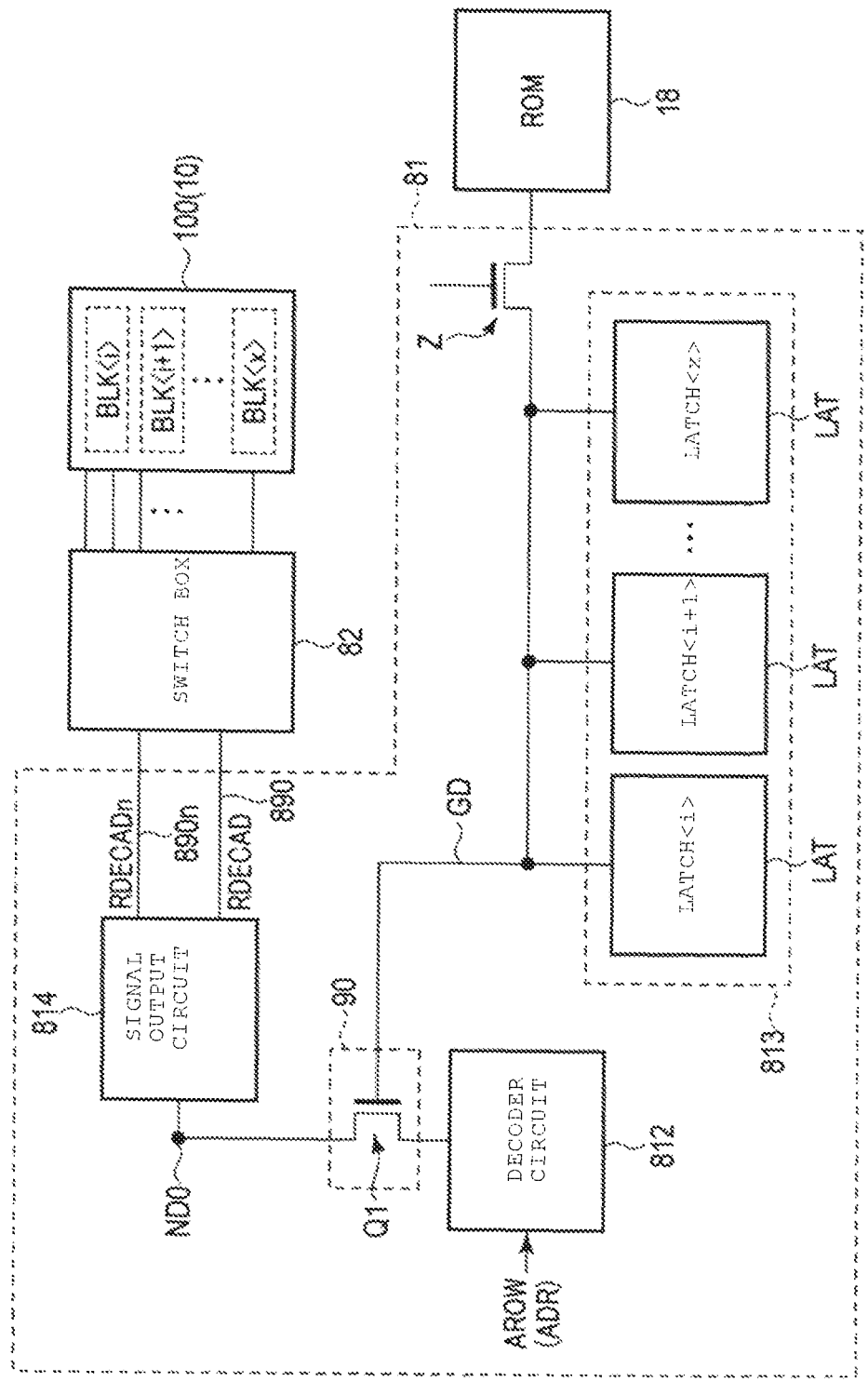
FIG. 7 is a block diagram illustrating a decoder circuit of the memory device according to the embodiment.

FIG. 7 is a block diagram schematically illustrating a configuration example of the block decoder included in the memory device according to the embodiment.

As illustrated in FIG. 7, in the memory device according to the embodiment, the block decoder 81 includes a decoder circuit 812, an information storage circuit 813, a signal output circuit 814, and a determination circuit 90.

The decoder circuit 812 receives a signal AROW corresponding to the address ADR. The decoder circuit 812 is controlled (activated) based on the signal AROW.

The information storage circuit 813 stores the bad block information of the plurality of blocks BLK of which activation is controlled by the shared block decoder 81.

The information storage circuit 813 includes a plurality of latch circuits (more generally, "signal retention circuits") LAT. The number of the latch circuits LAT included in one block decoder 81 corresponds to the number of the blocks BLK corresponding to one block decoder 81.

When four blocks BLK are assigned to one block decoder 81, four latch circuits LAT are provided in the information storage circuit 813. The latch circuits LAT correspond to the blocks BLK in a one-to-one manner.

The latch circuit LAT is configured to hold the bad block information. In the activated block decoder 81, it is indicated whether or not the block BLK corresponding to the latch circuit LAT is a bad block (e.g., a defective block) by the bad block information in the latch circuit LAT.

For example, the bad block information to one block BLK is indicated by data (signal of the H level or the L level) of one bit. When the bad block information is the signal of the L level, the block BLK is deemed to be a bad block. When the bad block information is the signal of the H level, the block BLK is deemed to be a usable block.

In one embodiment, the bad block information is transferred from the ROM region 18 to the latch circuit LAT when the memory device 1 is activated (e.g., when power supply of the memory system/storage device is input). The bad block information may be supplied from the memory controller 5 (or a host device) to the memory device 1.

The bad block information is obtained during a test process prior to shipment of the memory device 1. However, the bad block information may be derived from deterioration information (for example, the number of the erasing operations of a block) of the block BLK as it is being used after the shipment of the memory device 1.

The plurality of latch circuits LAT are connected to one common wiring (signal line and node) GD.

The plurality of latch circuits LAT are connected to the ROM region 18 via a switch element (transistor) Z.

The determination circuit 90 determines whether or not a block of the decoded address is a bad block based on the bad block information.

The determination circuit 90 is connected between the decoder circuit 812 and the signal output circuit 814.

A first terminal of the determination circuit 90 is connected to an input terminal of the signal output circuit 814 via a node ND0. A second terminal of the determination circuit 90 is connected to one end of the decoder circuit 812.

The determination circuit 90 includes, for example, one transistor Q1. A gate of the transistor Q1 is connected to a node GD.

The transistor Q1 is turned on or turned off in accordance with a signal of the latch circuit LAT output to the node GD. That is, the potential of the node ND0 is changed. That is, the potential of the node ND0 is changed in accordance with the bad block information stored in the latch circuit LAT.

The signal output circuit 814 determines the signal level of the control signals RDECAD and RDECADn based on the potential of the node ND0 on which the bad block information is reflected.

The signal input terminal of the signal output circuit 814 is connected to the node ND0. The signal output terminal of the signal output circuit 814 is connected to the switch box 82 via the nodes 890 and 890n.

The memory device 1 according to the embodiment employs a block decoder configured with relatively small number of elements and number of wirings by using a circuit configuration of the block decoder illustrated in FIG. 7.

As a result, in the memory device according to the embodiment, a manufacturing cost can be reduced.

Specific Example

An internal configuration of the block decoder of the memory device according to the embodiment will be described with reference to FIG. 8.

Figure 8:
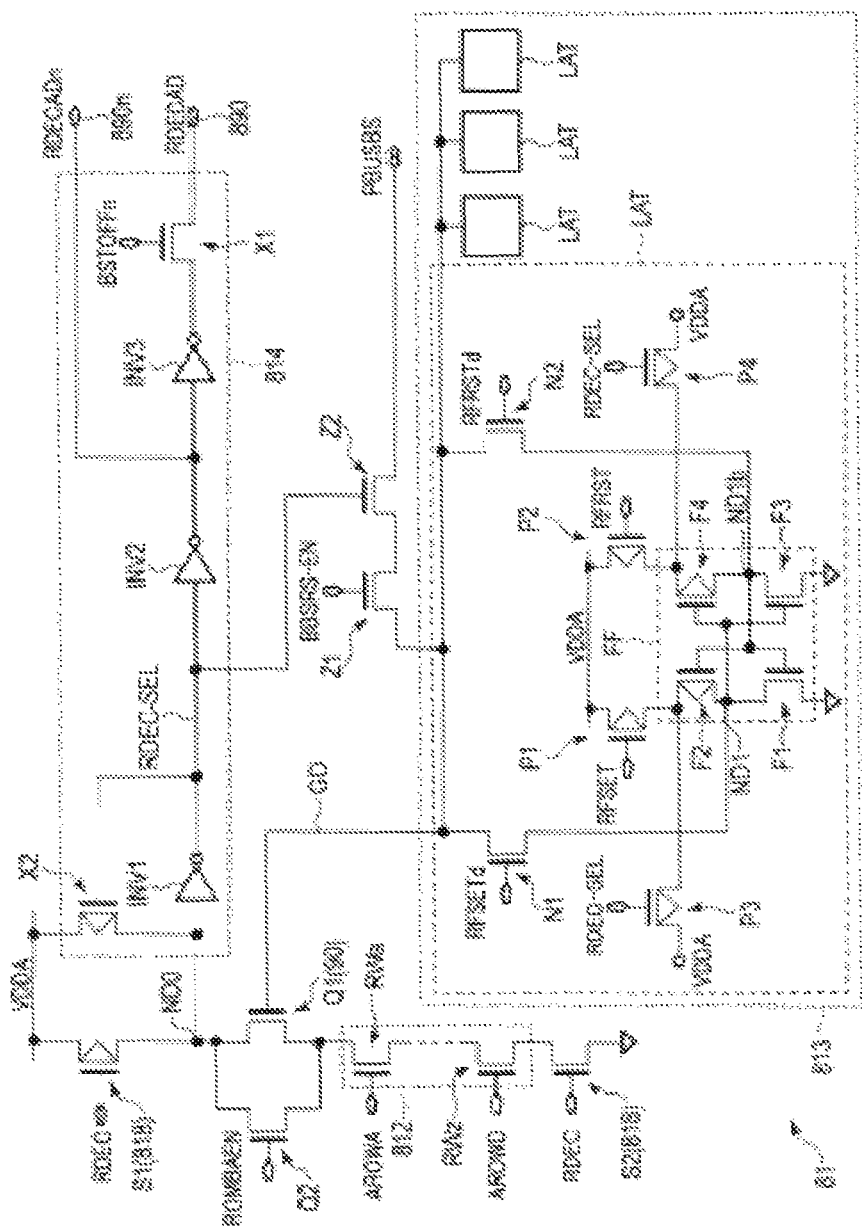
FIG. 8 is an equivalent circuit diagram illustrating an internal configuration of the decoder circuit of the memory device according to the embodiment.

FIG. 8 is an equivalent circuit diagram illustrating one specific example of the internal configuration of the block decoder (shared block decoder) of the memory device according to the embodiment.

As described above, the block decoder includes the latch circuits (for example, four latch circuits) LAT as the information storage circuit 813. Only the internal configuration of one latch circuit LAT is illustrated in FIG. 8 for the sake of simplicity of illustration.

As illustrated in FIG. 8, the plurality of latch circuits LAT are connected to the node (wiring) GD in the block decoder 81.

The latch circuit LAT includes a flip-flop FF. The flip-flop FF includes four transistors F1, F2, F3, and F4.

One end of the n-type transistor F1 is connected to a node ND1. The other end of the n-type transistor F1 is connected to the ground node Vss. One end of the p-type transistor F2 is connected to the node ND1. The other end of the p-type transistor F2 is connected to a power supply node VDDA through a p-type transistor P1.

A gate of the n-type transistor F1 and a gate of the p-type transistor F2 are connected to a node ND1*b*.

One end of the n-type transistor F3 is connected to the node ND1*b*. The other end of the n-type transistor F3 is connected to the ground node Vss. One end of the p-type transistor F4 is connected to the node ND1*b*. The other end of the p-type transistor F4 is connected to the power supply node VDDA through a p-type transistor P2.

A gate of the n-type transistor F3 and a gate of the p-type transistor F4 are connected to the node ND1.

As a control element of voltage supply on the flip-flop FF, The p-type transistors P1 and P2 are connected to the flip-flop FF to control the voltage supplied to the flip-flop FF.

One end of the p-type transistor P1 is connected to the other end of the p-type transistor F2. The other end of the p-type transistor P1 is connected to the power supply node VDDA.

A control signal RFSET is supplied to the gate of the p-type transistor P1. The p-type transistor P1 is turned on or turned off in accordance with a signal level of the control signal RFSET.

One end of the p-type transistor P2 is connected to the other end of the p-type transistor F4. The other end of the p-type transistor P2 is connected to the power supply node VDDA.

A control signal RFRST is supplied to the gate of the p-type transistor P2. The p-type transistor P2 is turned on or turned off in accordance with a signal level of the control signal RFRST.

The latch circuit LAT further includes p-type transistors P3 and P4.

One end of the p-type transistor P3 is connected to the other end of the p-type transistor F2. The other end of the p-type transistor P3 is connected to the power supply node VDDA.

One end of the p-type transistor P4 is connected to the other end of the p-type transistor F4. The other end of the p-type transistor P4 is connected to the power supply node VDDA.

Gates of the p-type transistors P3 and P4 are connected to a node RDEC-SEL which will be described later. A potential of the node RDEC-SEL is supplied to the gates of the p-type transistors P3 and P4 as a control signal RDEC-SEL. The p-type transistor P3 is turned on or turned off in accordance with a signal level of the control signal RDEC-SEL.

The p-type transistors P3 and P4 controls the supply of the power supply voltage VDDA to the flip-flop FF by the control signal RDEC-SEL different from that of the transistors P1 and P2.

The latch circuit LAT includes n-type transistors N1 and N2. The n-type transistors N1 and N2 function as transfer gates of the latch circuit LAT.

One end of the n-type transistor N1 is connected to the node ND1. The other end of the n-type transistor N1 is connected to the node GD.

A control signal RFSETd is supplied to the gate of the n-type transistor N1. The n-type transistor N1 is turned on or turned off in accordance with a signal level of the control signal RFSETd.

One end of the n-type transistor N2 is connected to the node ND1*b*. The other end of the n-type transistor N2 is connected to the node GD.

The control signal RFRSTd is supplied to the gate of the n-type transistor N2. The n-type transistor N2 is turned on or turned off in accordance with a signal level of the control signal RFRSTd.

In addition, in the information storage circuit 813 in the block decoder 81, the plurality of latch circuits LAT has substantially the same circuit configuration. However, each of the plurality of latch circuits LAT is controlled by the control signals RFSET, RFSETd, RFRST, and RFRSTd which are independent from each other.

The determination circuit 90 has an n-type transistor Q1.

One end of the n-type transistor Q1 is connected to the node ND0. The other end of the n-type transistor Q1 is connected to the first terminal (one end of a transistor RWa) of the decoder circuit 812.

A gate of the n-type transistor Q1 is connected to the node GD.

The n-type transistor Q1 is turned on or turned off in accordance with a signal output from the latch circuit LAT to the node GD. That is, the n-type transistor Q1 is turned on or turned off in accordance with the bad block information.

The decoder circuit 812 includes a plurality of the n-type transistors RW (RWa, . . . , and RWz). The number of the transistors RW in the decoder circuit 812 corresponds to the number of bits indicating the address of the block BLK. Current paths of the plurality of the transistors RW are connected in series.

For the n-type transistor RWa of one end (high potential side) of the decoder circuit 812, one end of the n-type transistor RWa is connected to the node ND0 through the n-type transistor Q1. The other end of the n-type transistor RWa is connected to one end of another n-type transistor in the decoder circuit 812.

For the n-type transistor RWz of the other end (low potential side) of the decoder circuit 812, one end of the transistor RWz is connected to the other end of another n-type transistor in the decoder circuit 812. The other end of the transistor RWz is connected to the ground node Vss through the transistor S2.

Signals AROWa, . . . , and AROWz are respectively supplied to a gate of each of the transistors RWa, . . . , and RWz. One signal (for example, the signal AROWa) among a plurality of signals AROW is supplied to the gate of one transistor (for example, the transistor RWa) among a plurality of transistors RW.

When the block decoder 81 is activated based on the select address ADR, all the n-type transistors RW in the decoder circuit 812 of the block decoder 81 which are activated are turned on. In this case, all the signals AROW supplied to the decoder circuit 812 are set to the H level.

The block decoder 81 includes the transistors S1 and S2 as a control circuit 818. The transistors S1 and S2 perform the activation of the block decoder 81, the charge of the node ND0, the discharge of the node ND0, and the like.

The p-type transistor S1 is provided between the power supply node VDDA and the node ND0. One end of the p-type transistor S1 is connected to the power supply node VDDA. The other end of the p-type transistor S1 is connected to the node ND0.

The n-type transistor S2 is provided between the decoder circuit 812 and the ground node Vss. One end of the n-type transistor S2 is connected to the other end of the n-type transistor RWz. The other end of the n-type transistor S2 is connected to the ground node Vss. The current path of the decoder circuit 812 is provided between the transistor Q1 and the transistor S2.

A control signal RDEC is supplied to the gate of the p-type transistor S1 and the gate of the n-type transistor S2. Therefore, one transistor of two transistors S1 and S2 is turned on and the other transistor is turned off in accordance with a signal level of the control signal RDEC.

The signal output circuit 814 includes a plurality of inverters INV (INV1, INV2, and INV3) and transistors X1 and X2.

An input terminal of the inverter INV1 is connected to the node ND0. An output terminal of the inverter INV1 is connected to the node RDEC-SEL.

An input terminal of the inverter INV2 is connected to the node RDEC-SEL. An output terminal of the inverter INV2 is connected to a node RDECADn and an input terminal of the inverter INV3.

The input terminal of the inverter INV3 is connected to the output terminal of the inverter INV2. The output terminal of the inverter INV3 is connected to one end of the n-type transistor X1. The other end of the n-type transistor X1 is connected to a node RDECAD.

A control signal BSTOFFn is supplied to a gate of the n-type transistor X1. The n-type transistor X1 is turned on or turned off in accordance with a signal level of the control signal BSTOFFn. When the transistor X1 is turned on by the control signal BSTOFFn of the H level, an output signal of the inverter INV3 is output to the switch box 82 as the control signal RDECAD.

One end of the p-type transistor X2 is connected to the input terminals of the node ND0 and the inverter INV1. The other end of the p-type transistor X2 is connected to the power supply node VDDA.

A gate of the p-type transistor X2 is connected to the node RDEC-SEL (output terminal of the inverter INV1).

The p-type transistor X2 is turned on or turned off in accordance with the potential of the node RDEC-SEL. In addition, the potential of the node RDEC-SEL is supplied to the gates of the transistors P3 and P4 in the latch circuit LAT as the control signal RDEC-SEL of the latch circuit LAT.

The block decoder 81 includes the following elements in addition to the elements described above.

The n-type transistor Q2 is connected to the current path of the n-type transistor Q1 in parallel. One end of the n-type transistor Q2 is connected to one end (node ND0) of an n-type transistor Q1. The other end of the n-type transistor Q2 is connected to the other end of the n-type transistor Q1. A current path of the transistor Q2 is connected to a current path of the transistor Q1 in parallel.

A control signal ROMBAEN is supplied to the gate of the n-type transistor Q2. The n-type transistor Q2 is turned on or turned off in accordance with a signal level of the control signal ROMBAEN.

The n-type transistor Q2 has a connection path between the p-type transistor S1 and the decoder circuit 812.

A voltage and a current are supplied from the power supply node VDDA to the decoder circuit 812 by the n-type transistor Q2 without depending on ON/OFF of the n-type transistor Q1.

A node PBUSBS is connected to the ROM region 18.

The node PBUSBS is connected to the node GD via two transistors Z1 and Z2. The bad block information in the ROM region 18 is transferred to the latch circuit LAT via the transistors Z1 and Z2.

One end of the transistor Z1 is connected to the node GD and transfer gates N1 and N2. The other end of the transistor Z1 is connected to one end of the transistor Z2. The other end of the transistor Z2 is connected to the node PBUSBS.

A control signal BBSRS-EN is supplied to a gate of the transistor Z1. The transistor Z1 is turned on or turned off in accordance with the control signal BBSRS-EN.

A gate of the transistor Z2 is connected to a node RDEC_SEL. A potential of the node RDEC_SEL is supplied to the gate of the transistor Z2 as a control signal.

2. Operation Example

Figure 9:
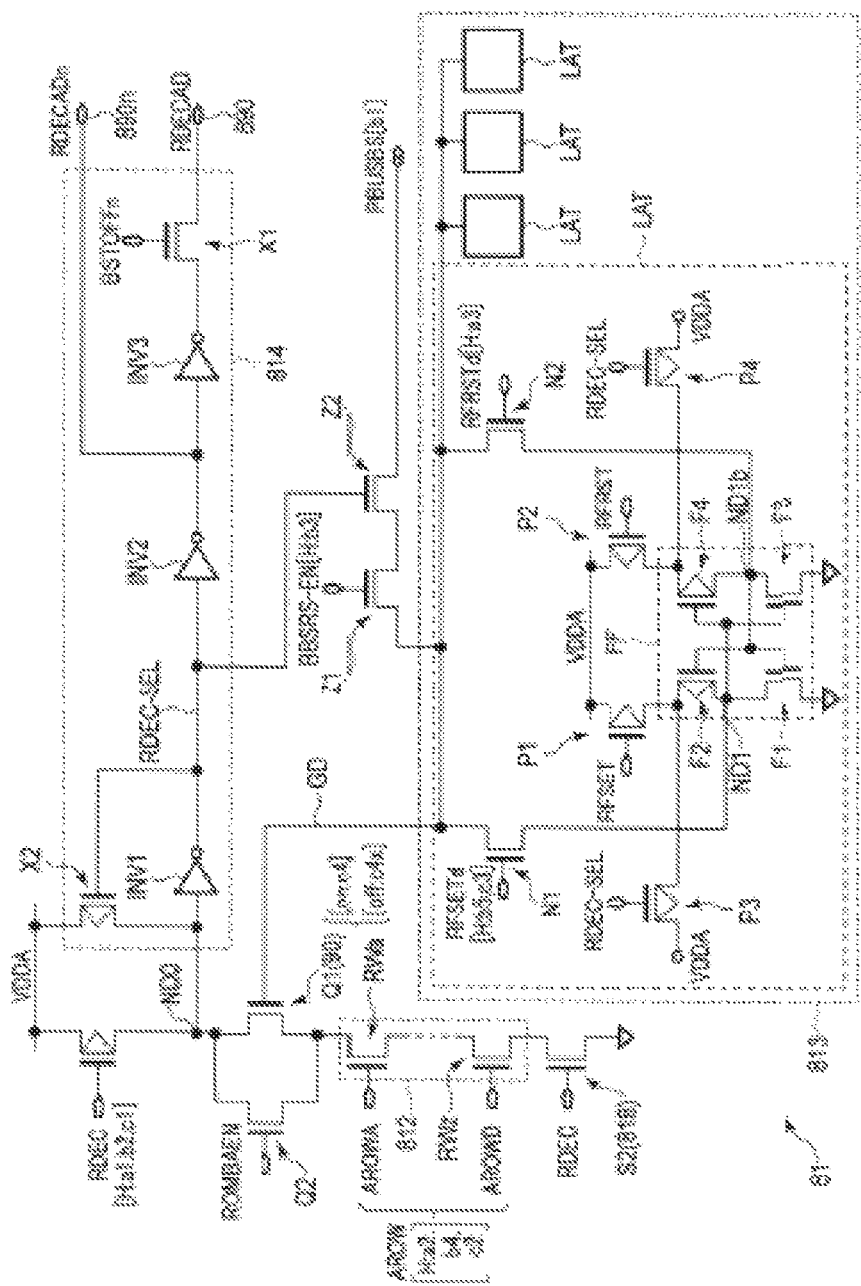
FIG. 9 is a diagram describing an operation of the decoder circuit of the memory device according to the embodiment.

An operation example (control method) of the memory device according to the embodiment will be described with reference to FIG. 9. FIG. 9 is a schematic diagram describing an operation of the block decoder included in the memory device according to the embodiment. Here, the operation of the block decoder of the memory device according to the embodiment will be described appropriately with reference to FIGS. 1 to 8 in addition to FIG. 9.

Transfer and Storage of Defect Information

The memory device according to the embodiment performs transfer and storage of the defect information (bad block information) with respect to the block decoder as an example of a sequence illustrated in FIG. 9.

A power supply voltage is applied to the storage device 500 (of the memory system 9) of FIG. 1 and the storage device is activated.

The sequencer 19 performs a reset operation to the latch circuit LAT in the block decoder 81 during the activation of the storage device 500.

The power supply voltage VDDA is supplied to the latch circuit LAT.

The sequencer 19 changes the control signal RDEC from the L level to the H level for the reset operation of the latch circuit LAT (sequence a1). Therefore, the block decoder 81 is set to an enable state.

In the decoder circuit 812 of a target of the reset operation, the signal AROW of the H level is supplied to the gate of each transistor RW (sequence a2).

The sequencer 19 sets the node GD to a certain potential for the reset operation.

The sequencer 19 sets the control signal RFRSTd to the H level (sequence a3). Therefore, the transfer gate N2 is turned on.

Therefore, the potential of the nodes ND1 and ND1b in the flip-flop FF is set as a potential indicating a reset state.

After the control signal RFRSTd is set to the L level, the sequencer 19 sets the control signal RDEC as the L level. The decode signal AROW of the L level is supplied to each transistor RW.

Therefore, the reset operation to the latch circuit LAT is completed.

During the activation of the storage device, the bad block information is transferred to the block decoder 81 by the reset operation as follows. As a result, the bad block information of each block BLK is stored in the latch circuit LAT corresponding to the block BLK.

For example, the sequencer 19 reads the bad block information in the ROM region 18. The sequencer 19 transfers the bad block information (signal of the H level or the L level) of a block in the ROM region 18 to the block decoder 81 corresponding to the block BLK.

The bad block information is supplied to the node PBUSBS (sequence b1).

The sequencer 19 performs the reset operation to the latch circuit LAT to store the bad block information in the block decoder 81.

The sequencer 19 sets the signal level of the control signal RDEC as the H level in the block decoder 81 in which the bad block information is stored (sequence b2). The sequencer 19 sets the control signal BBSRS-EN as the H level (sequence b3). In addition, the decode signal AROW of the H level is supplied to the gate of each transistor RW (sequence b4).

The sequencer 19 sets the control signal ROMBAEN as the H level. In this case, the signal level of the control signal (node) RDEC-SEL is set to the H level.

Therefore, the transistors Z1 and Z2 are turned on. The node PBUSBS is in a state of being capable of connecting to the latch circuit LAT.

The sequencer 19 sets the control signal RFSETd as the H level (sequence b5). Therefore, the node ND1 of the flip-flop FF is electrically connected to the node PBUSBS.

The potential of the node PBUSBS is set to the H level or the L level in accordance with the bad block information.

Therefore, the potential of the node ND1 is set to the H level or the L level in accordance with the potential of the node PBUSBS. A potential of a node ND1n of the flip-flop FF becomes a level opposite to the potential of the node ND1.

The sequencer 19 changes the signal level of the control signal RFSETd from the H level to the L level. Therefore, the reset operation of the latch circuit LAT is completed. The sequencer 19 changes the signal level of the control signal RDEC from the H level to the L level. Therefore, the block decoder 81 is inactivated.

As a result, the bad block information is stored in the latch circuit LAT in the block decoder 81.

Access to Block

The memory device according to the embodiment controls activation and inactivation of a block as follows using the bad block information stored in the block decoder 81 during writing of data, reading of data, and erasing of data.

The memory controller 5 transmits the command CMD, the control signal CNT, and the address ADR to the memory device 1 in accordance with a request from the host device 600. The memory device 1 starts an operation based on the command CMD to a block indicated by the address ADR.

The sequencer 19 changes the signal level of the control signal RDEC of the block decoder 81 corresponding to the selected block from the L level to the H level (sequence c1).

The signal AROW of the H level is supplied to the gate of each transistor RW in the decoder circuit 812 of the block decoder 81 corresponding to the selected block (sequence c2).

In this case, the node ND0 is electrically isolated from the ground node Vss by the transistor Q1 of the OFF state. Therefore, the node ND0 is charged.

The bad block information in the latch circuit LAT corresponding to the selected block BLK is output to the node GD based on the address ADR.

For example, the sequencer 19 controls the signal level of the control signal RFSETd (or the control signal RFRSTd) (sequence c3). Therefore, the node ND1 (or the node ND1b) of the flip-flop FF is electrically connected to the node GD via the transfer gate N1 (or the transfer gate N2) of the ON state.

The potential of the node GD is set in accordance with the potential of the node ND1 (node ND1b).

After a signal indicating the bad block information is output from the latch circuit LAT to the node GD, the transfer gate N1 (transfer gate N2) may be turned off.

The transistor Q1 is turned on or turned off in accordance with the potential of the node GD.

When the potential of the node GD is at the H level (when the selected block is a block to be used), the transistor Q1 is turned on (sequence c4).

In this case, the node ND0 is electrically connected to the ground node Vss. Therefore, the node ND0 is discharged and the potential of the node ND0 is set to the L level.

The inverter INV1 outputs a signal of the H level by a signal of the L level.

The signal of the H level on the node RDEC-SEL is input into the inverter INV2. The inverter INV2 outputs the signal of the L level. The signal of the L level is supplied to the node RDECADn.

The inverter INV3 outputs the signal of the H level. The signal of the H level is supplied to the node RDECAD via the transistor Q1 of the ON state.

Therefore, the signal level of the control signal RDECAD is set to the H level. On the other hand, the signal level of the control signal RDECADn is set to the L level.

As a result, the transistor TG in the switch box 82 is turned on the block BLK indicated by the address ADR is activated. An output voltage of the drivers 830-D, 830-W, and 830-S in accordance with an operation to be performed is supplied to each of the wirings SGD, WL, and SGS in the block BLK by the switch unit 820 in FIG. 6.

Therefore, an operation corresponding to the command CMD is performed to the block BLK indicated by the address ADR.

When the potential of the node is in the L level (when the selected block is the bad block), the transistor Q1 is turned off (sequence c4x).

In this case, the node ND0 maintains the charged state and the potential of the node ND0 is set to the H level.

The inverter INV1 outputs the signal of the L level by the signal of the H level.

The inverter INV2 supplies the signal of the H level to the node RDECADn.

The inverter INV3 supplies the signal of the L level to the node RDECAD via the transistor X1 of the ON state.

Therefore, the signal level of the control signal RDECAD is set to the L level the signal level of the control signal RDECADn is set to the H level.

As a result, the transistor TGn is turned on for the block BLK indicated by the address ADR. Each of the wirings SGD and SGS in the block BLK is electrically isolated from the driver circuit 83 by the switch unit 820 of FIG. 6. The select gate lines STD and STS are connected to the ground node Vss by the transistor TGn of the ON state.

As described above, the operation corresponding to the command CMD is not performed in the block BLK indicated by the address ADR.

For example, the operation corresponding to the command CMD is performed in a redundancy block that is a replacement for the bad block.

As described above, in the memory device according to the embodiment, the activation or the inactivation of the block BLK is controlled based on the bad block information in the block decoder 81.

In addition, the operation example of the block decoder illustrated in FIG. 9 is an example and the operation of the block decoder of the memory device according to the embodiment is not limited to the example of FIG. 9.

3. Modification Example

A modification example of the memory device according to the embodiment will be described with reference to FIG. 10.

Figure 10:
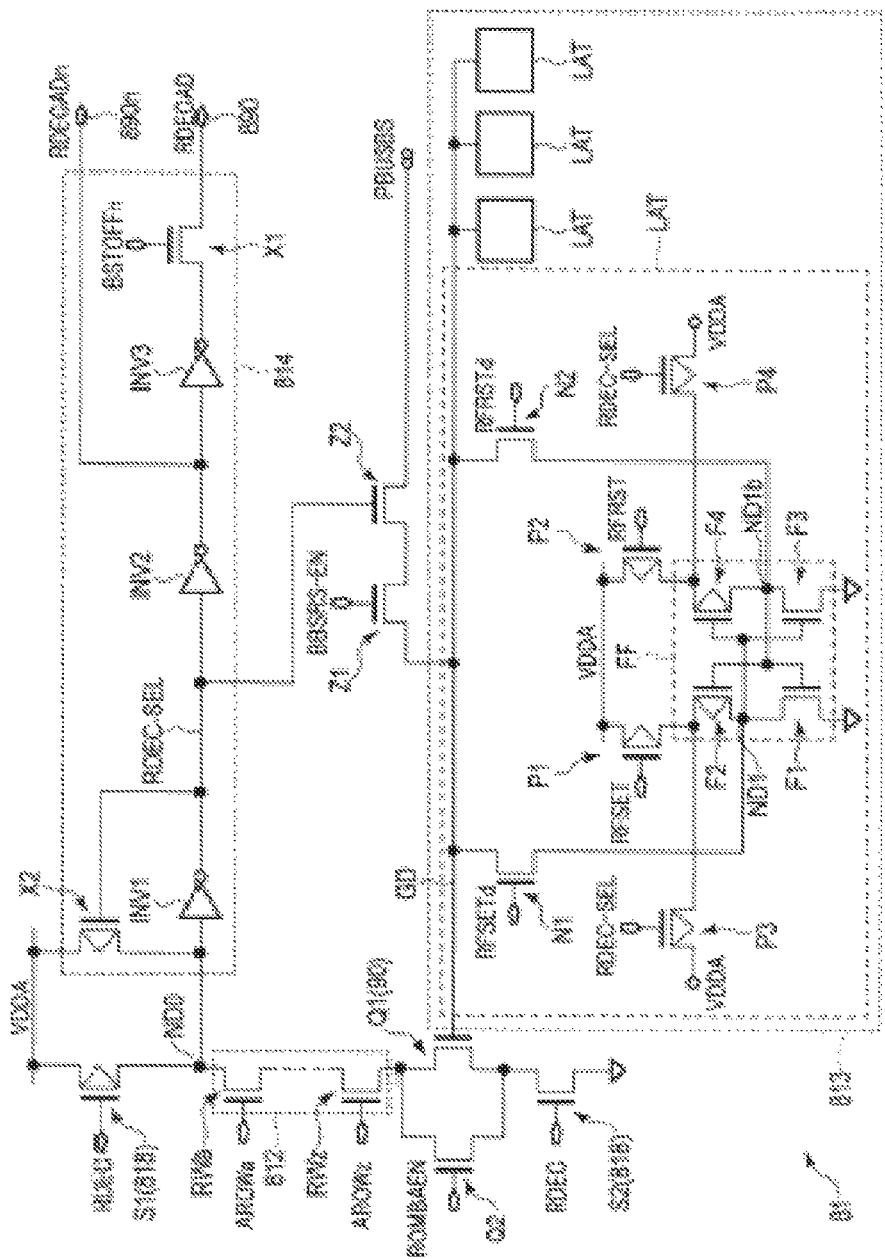
FIG. 10 is an equivalent circuit diagram illustrating a modification of the decoder circuit of the memory device according to the embodiment.

FIG. 10 is an equivalent circuit diagram illustrating a modification example of a block decoder in the memory device according to the embodiment.

As illustrated in FIG. 10, a transistor Q1 of a determination circuit 90 may be connected between a decoder circuit 812 and a ground node Vss.

In addition, the transistor Q1 as the determination circuit 90 may be a p-type transistor in accordance with a signal level indicating bad block information and/or a configuration of a latch circuit LAT.

Even when a block decoder 81 has a circuit configuration illustrated in FIG. 10, it is possible to obtain substantially the same effects as those of the block decoder of FIGS. 7 and 8.

4. Summary

The memory device according to the embodiment can reduce the number of elements and the number of wirings used for the decoder circuit by the configuration of the decoder circuit (block decoder) illustrated in FIGS. 7 to 10.

For example, in the shared block decoder of a memory device of the related art, a determination circuit is provided for each latch circuit holding bad block information. In addition, a transistor for activating one of a plurality of determination circuits based on the address is provided in each determination circuit.

Therefore, a plurality of transistors which are used as the determination circuits, a plurality of transistors for controlling the determination circuits, and a plurality of wirings for connecting the plurality of determination circuits and the plurality of latch circuits, are provided in the shared block decoder of the memory device of the related art.

In contrast, in the memory device according to the embodiment, one determination circuit (e.g., transistor) is provided for a plurality of latch circuits in the block decoder.

Therefore, the memory device according to the embodiment can reduce the manufacturing cost of the memory device.

5. Others

In the embodiments described above, the configuration of the row decoder circuit in which one block decoder 81 is shared by the plurality of blocks BLK is illustrated.

Meanwhile, the configuration of FIGS. 7 to 10 may be applied to an embodiment where one block decoder 81 is provided for one block BLK, and a plurality of control units, e.g., string units, are set in one block BLK. In such a case, the plurality of latch circuits LAT of the block decoder may hold the defect information of each control unit.

For example, in the three-dimensional memory cell array of FIG. 4, the plurality of latch circuits LAT in the block decoder 81 are each associated with a respective one of the plurality of string units SU in the block. One latch circuit LAT holds the defect information of one string unit SU.

As described above, one block decoder may hold the defect information about the plurality of control units in one block decoder.

Also in this case, it is possible to obtain substantially the same effects as those of the configuration described with reference to FIGS. 7 to 10.

In the memory cell array including the three-dimensional memory cell array according to the embodiment, one NAND string may include two semiconductor pillars.

In this case, the NAND string includes two semiconductor pillars and a semiconductor portion connecting the two semiconductor pillars.

The semiconductor portion connects a lower end of one semiconductor pillar to a lower end of the other semiconductor pillar.

An upper end of one semiconductor pillar is connected to the bit line. An upper end of the other semiconductor pillar is connected to the source line. The drain-side select transistor is provided on an upper portion side of one semiconductor pillar. The source-side select transistor is positioned on the upper portion side of the other semiconductor pillar. The source-side select transistor is positioned at the same height as the drain-side select transistor above a substrate.

In each semiconductor pillar, the memory cells are respectively provided on the side surface of the semiconductor pillar in a region between the select transistor and the semiconductor portion.

In the embodiments described above, the memory device having the three-dimensional memory cell array is illustrated. However, the memory device according to the embodiment may be a memory device having a two-dimensional memory cell array. In the two-dimensional memory cell array, a plurality of memory cells are arranged on the semiconductor substrate in a matrix shape along a D1 direction and a D2 direction.

The memory device used in the memory system according to the embodiment may be a multi-value semiconductor memory device.

A reading operation of the multi-value semiconductor memory device includes a determination voltage as follows.

The determination voltage that is applied to the word line selected for a reading operation of an A level is, for example, between 0 V and 0.55 V. However, the determination voltage of the A level is not limited to the value and may be any one of range of 0.1 V to 0.24 V, 0.24 V to 0.31 V, 0.31 V to 0.4 V, 0.4 V to 0.5 V, and 0.5 V to 0.55 V.

The determination voltage that is applied to the word line selected for the reading operation of a B level is, for example, between 1.5 V and 2.3 V. However, the determination voltage of the B level is not limited to the value and may be any one of range of from 1.65 V to 1.8 V, from 1.8 V to 1.95 V, from 1.95 V to 2.1 V, and from 2.1 V to 2.3 V.

The determination voltage that is applied to the word line selected for the reading operation of a C level is, for example, between 3.0 V and 4.0 V. The determination voltage of the C level is not limited to the value and may be any one of range of 3.0 V to 3.2 V, 3.2 V to 3.4 V, 3.4 V to 3.5 V, 3.5 V to 3.6 V, and 3.6 V to 4.0 V.

In addition, a period (tR) of the reading operation may be, for example, one of periods of 25 μs to 38 μs, 38 μs to 70 μs, and 70 μs to 80 μs.

The writing operation of the multi-value semiconductor memory device includes the program operation and the verifying operation.

In the writing operation of the multi-value semiconductor memory device, a voltage initially applied to the word line that is selected during the program operation is, for example, between 13.7 V and 14.3 V. The voltage is not limited to the value and may be, for example, any one of ranges of 13.7 V to 14.0 V and 14.0 V to 14.6 V.

When the program operation is an incremental step pulse program (ISPP) type, a voltage of step-up is, for example, approximately 0.5 V.

An unselected voltage (pass voltage) applied to the unselected word line is, for example, a value of a range of 6.0 V to 7.3 V. However, the unselected voltage is not limited to the value and may be, for example, a value of a range of 7.3 V to 8.4 V or may be equal to or less than 6.0 V.

The unselected word line is an odd-numbered word line, but the voltage to be applied may be changed to an even-numbered word line.

The time (tProg) of the writing operation may be, for example, any one of periods of 1,700 μs to 1,800 μs, 1,800 μs to 1,900 μs, and 1,900 μs to 2,000 μs.

An erasing operation of the multi-value semiconductor memory device is formed on an upper portion of the semiconductor substrate and a voltage initially applied to the well region arranged where the memory cell is arranged above is, for example, a value of a range of 12 V to 13.6 V. The voltage is not limited to the value and may be, for example, any one of ranges of 13.6 V to 14.8 V, 14.8 V to 19.0 V, 19.0 V to 19.8 V and 19.8 V to 21 V.

The time (tErase) of the erasing operation may be, for example, any one of periods of 3,000 μs to 4,000 μs, 4,000 μs to 5,000 μs, and 5,000 μs to 9,000 μs.

The memory cell has a charge storage layer arranged on the side surface of semiconductor pillar via a tunnel insulating film of from 4 nm to 10 nm. The charge storage layer may be a stacked structure of an insulating film (for example, SiN or SiON, and the like) having a film thickness of from 2 nm to 3 nm and polysilicon of a film thickness of from 3 nm to 8 nm. In addition, the polysilicon may contain metal such as Ru.

The insulating film is provided on the charge storage layer. The insulating film includes, for example, a lower High-k film having a film thickness of from 3 nm to 10 nm, an upper High-k film having a film thickness of from 3 nm to 10 nm, and a silicon oxide film having a film thickness of 4 nm to 10 nm interposed between the lower and upper High-k films. The High-k film includes a film such as HfO. In addition, the film thickness of the silicon oxide film may be thicker than the film thickness of the High-k film.

A control gate electrode having a film thickness of 30 nm to 70 nm is formed on the insulating film via a material having a film thickness of 3 nm to 10 nm. The material is a metal oxide film such as TaO and a metal nitride film such as TaN. The control gate electrode may be metal such as tungsten (W).

An air gap may be provided between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall in the scope and spirit of the inventions.

What is claimed is:

1. A memory device comprising:
  a memory cell array including a plurality of memory cell groups; and
  a decoder circuit configured to control selection of the memory cell groups, the decoder circuit including:
  an address decoder circuit including a plurality of first transistors of which channels are connected in series, and configured to activate the decoder circuit based on an input address, wherein the number of the first transistors corresponds to a number of bits of the input address, and signals corresponding to the input address are input to gates of the first transistors,
  a plurality of information retention circuits, each of which corresponds to one of the memory cell groups and outputs a signal that indicates whether or not the corresponding memory cell group is defective,
  a second transistor having a gate connected to each of the outputs of the information retention circuits and a channel connected in series to the channels of the first transistors, and
  a signal output circuit configured to output a control signal for selecting or not selecting the memory cell groups based on an on/off state of the second transistor.

2. The device according to claim 1, wherein the decoder circuit is a shared decoder circuit and the memory cell groups are each a block of memory cells that are erased collectively as a unit.

3. The device according to claim 1, wherein the memory cell groups are string units that together form one block of memory cells that are erased collectively as a unit, each of the string units including a plurality of strings, where each string includes a plurality of memory cells connected in series.

4. The device according to claim 1, wherein the second transistor is turned on to cause the signal output circuit to output the control signal for selecting the memory cell groups, and turned off to cause the signal output circuit to output the control signal for not selecting the memory cell groups.

5. The device according to claim 1, wherein each of the information retention circuits is a latch circuit.

6. The device according to claim 5, wherein the latch circuit includes a flip-flop circuit.

7. The device according to claim 6, wherein the latch circuit further includes a first transfer gate connected between a first output node of the flip-flop circuit and the gate of the second transistor and a second transfer gate connected between a second output node of the flip-flop circuit and the gate of the second transistor, the first and second transfer gates being controlled in accordance with control signals.

8. The device according to claim 1, further comprising:
  a non-volatile memory storing information about which memory cell groups are defective; and
  a control unit configured to read the information from the non-volatile memory and set a voltage level of a node connected to the information retention circuits based on the information.

9. The device according to claim 8, wherein each of the information retention circuits retains the information stored in the non-volatile memory for a corresponding one of the memory cell groups.

10. A memory device comprising:
  a memory cell array including a plurality of blocks of memory cells; and
  a block decoder circuit including a signal output circuit, an address decoder circuit including a plurality of first transistors of which channels are connected in series, a first latch storing first information indicating whether or not a first group of memory cells is a defective group, and a second latch storing second information indicating whether or not a second group of memory cells is a defective group, wherein
  the number of the first transistors corresponds to a number of bits of an input address, and signals corresponding to the input address are input to aates of the first transistors, and
  the first and second latches have outputs that are each connected to a gate of a second transistor that causes the signal output circuit to generate either a block selection signal or a block non-selection signal, a channel of the second transistor being connected in series to the channels of the first transistors.

11. The device according to claim 10, wherein the block decoder circuit is a shared decoder circuit and the first and second groups of memory cells are each a block of memory cells that are erased collectively as a unit.

12. The device according to claim 10, wherein the first and second groups of memory cells are each a string unit that includes a plurality of strings, where each string includes a plurality of memory cells connected in series.

13. The device according to claim 10, wherein the second transistor is turned on to cause the signal output circuit to output the block selection signal, and turned off to cause the signal output circuit to output the block non-selection signal.

14. The device according to claim 10, wherein each of the first and second latch circuits includes a flip-flop circuit.

15. The device according to claim 14, wherein each of the first and second latch circuits further includes a first transfer gate connected between a first output node of the flip-flop circuit and the gate of the second transistor and a second transfer gate connected between a second output node of the flip-flop circuit and the gate of the second transistor, the first and second transfer gates being controlled in accordance with control signals.

16. The device according to claim 10, further comprising:
a non-volatile memory storing information about which groups of memory cells are defective; and
a control unit configured to read the information from the non-volatile memory and set a voltage level of a node connected to the first and second latch circuits based on the information.

17. The device according to claim 16, wherein the first latch circuit retains the information stored in the non-volatile memory for the first group of memory cells, and the second latch circuit retains the information stored in the non-volatile memory for the second group of memory cells.

18. The device according to claim 1, wherein
the channel of the second transistor is connected between an input node of the signal output circuit and the address decoder circuit.

19. The device according to claim 18, further comprising:
a third transistor having a channel that is connected in parallel with the channel of the second transistor and between the input node of the signal output circuit and the address decoder circuit, the third transistor being turned on when information is set in at least one of the information retention circuits.

20. The device according to claim 10, wherein
the channel of the second transistor is connected between an input node of the signal output circuit and the address decoder circuit, and
the device further comprises a third transistor having a channel that is connected in parallel with the channel of the second transistor and between the input node of the signal output circuit and the address decoder circuit, the third transistor being turned on when information is set in at least one of the information retention circuits.

* * * * *